United States Patent
Felber et al.

(10) Patent No.: US 7,205,567 B2
(45) Date of Patent: Apr. 17, 2007

(54) SEMICONDUCTOR PRODUCT HAVING A SEMICONDUCTOR SUBSTRATE AND A TEST STRUCTURE AND METHOD

(75) Inventors: Andreas Felber, Dresden (DE); Susanne Lachenmann, Munich (DE); Valentin Rosskopf, Poettmes-Schorn (DE); Sibina Sukman-Praehofer, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/336,384

(22) Filed: Jan. 20, 2006

(65) Prior Publication Data

US 2006/0175647 A1 Aug. 10, 2006

(30) Foreign Application Priority Data

Jan. 21, 2005 (DE) .................. 10 2005 003 000

(51) Int. Cl.
*H01L 23/58* (2006.01)
*H01L 21/66* (2006.01)

(52) U.S. Cl. .............. 257/48; 257/301; 257/E27.092; 438/14; 438/18

(58) Field of Classification Search .............. 257/48, 257/296, 301, E27.092; 438/14, 17, 18
See application file for complete search history.

(56) References Cited

U.S. PATENT DOCUMENTS

| | | | |
|---|---|---|---|
| 6,339,228 B1 | 1/2002 | Iyer et al. | |
| 6,563,160 B2 * | 5/2003 | Clevenger et al. | 257/301 |
| 6,853,000 B2 * | 2/2005 | Felber et al. | 257/48 |
| 6,946,678 B2 * | 9/2005 | Wu et al. | 257/48 |
| 2004/0057292 A1 | 3/2004 | Lachenmann et al. | |
| 2004/0061110 A1 | 4/2004 | Felber et al. | |
| 2005/0051765 A1 | 3/2005 | Rosskopf et al. | |
| 2005/0196918 A1 * | 9/2005 | Schwerin | 438/243 |

FOREIGN PATENT DOCUMENTS

| | | |
|---|---|---|
| DE | 102 42 054 B3 | 4/2004 |
| DE | 102 45 533 A1 | 4/2004 |
| DE | 103 40 714 B3 | 5/2005 |

\* cited by examiner

*Primary Examiner*—T. N. Quach
(74) *Attorney, Agent, or Firm*—Slater & Matsil, L.L.P.

(57) ABSTRACT

A semiconductor product having a test structure, in which a contact connection short-circuits that source/drain region of a transistor which is connected to an inner capacitor electrode of a trench capacitor by a dopant diffusion region with an interconnect is disclosed. Methods are disclosed for making an electrical measurement, to determine the nonreactive resistance of dopant diffusion regions, the so-called "buried straps", without the measurement result being corrupted by the nonreactive resistance of a transistor channel. In accordance with one embodiment of the invention having a plurality of electrical connections of the capacitor electrode, static currents can also be conducted through a buried strap and the capacitor electrode. Embodiments are disclosed that make it possible to perform at novel test structures of a semiconductor wafer electrical resistance measurements, which cannot be carried out at memory cells of a memory cell array themselves.

24 Claims, 7 Drawing Sheets

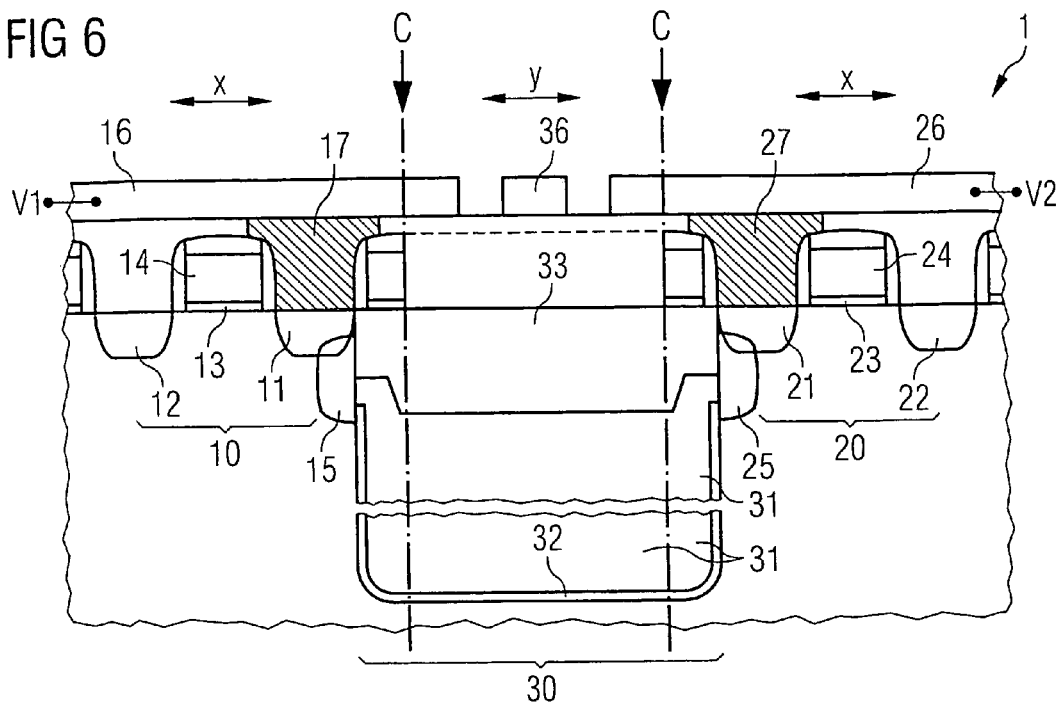
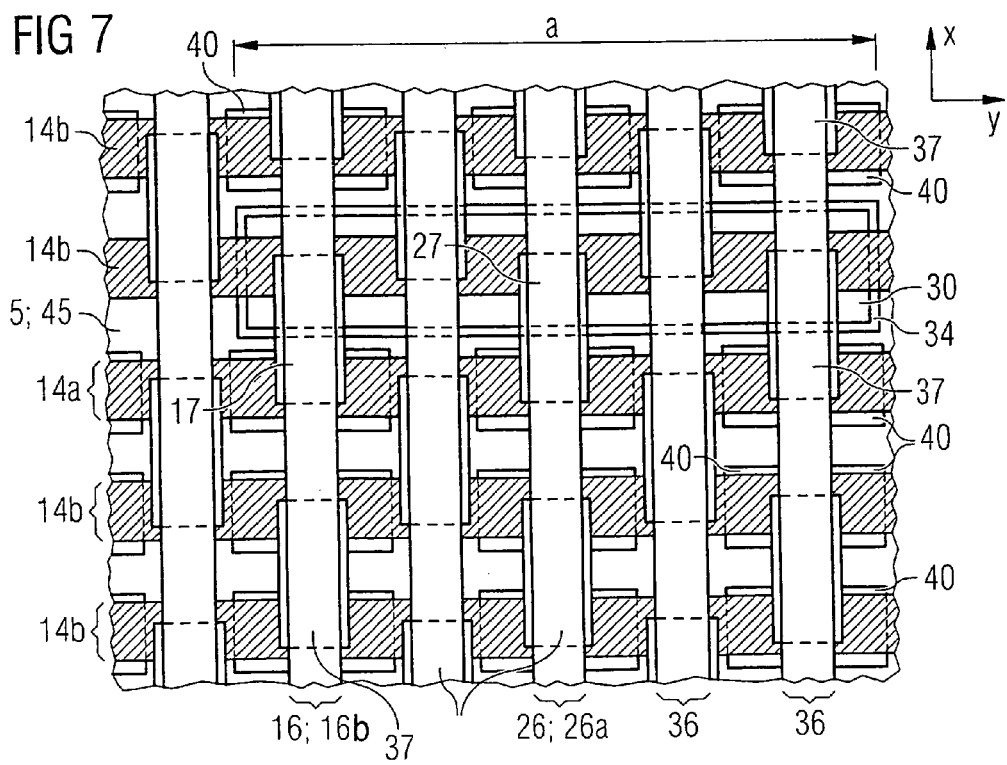

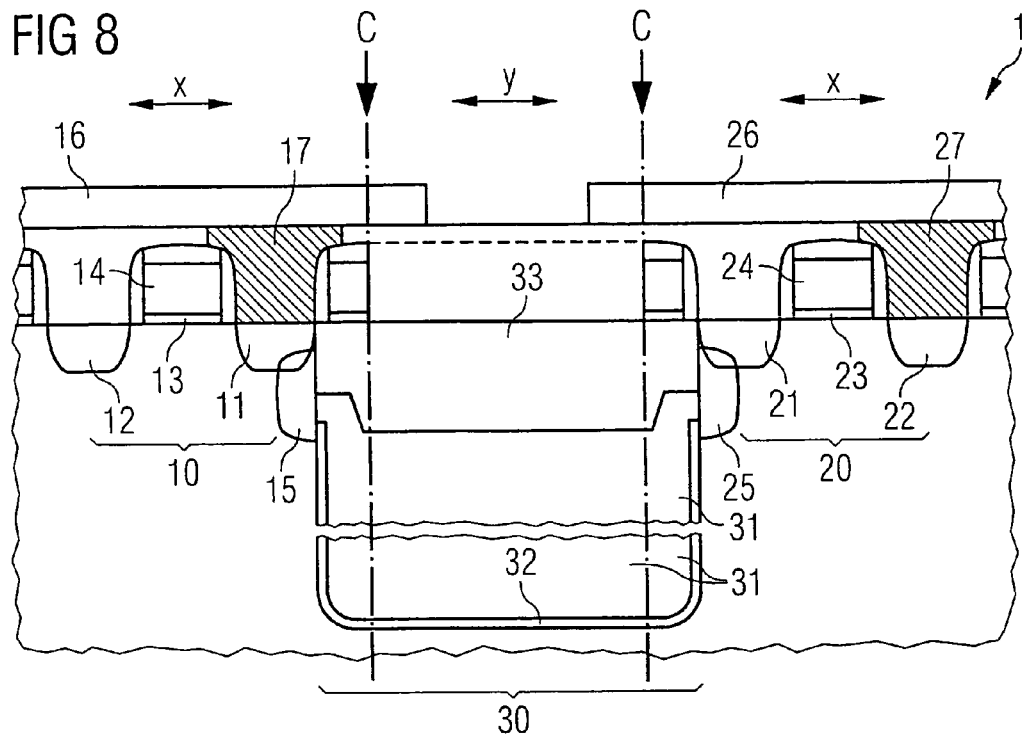
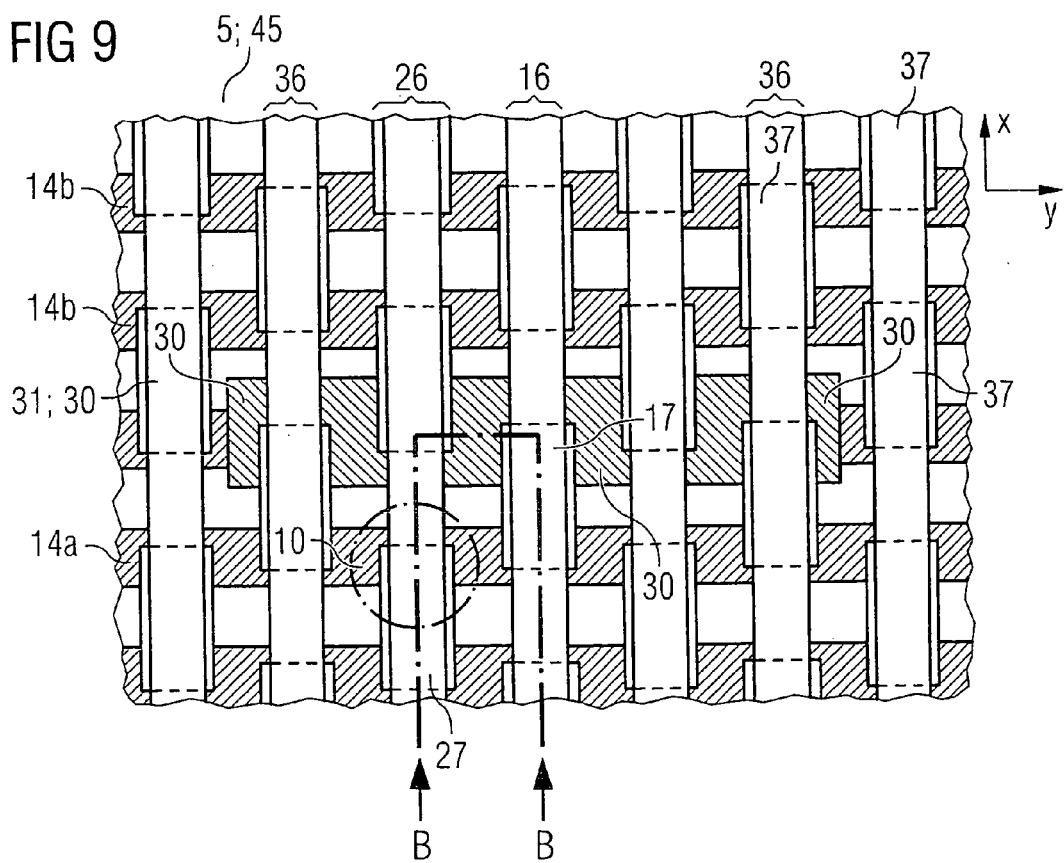

SEMICONDUCTOR PRODUCT HAVING A SEMICONDUCTOR SUBSTRATE AND A TEST STRUCTURE AND METHOD

This application claims priority to German Patent Application 10 2005 003 000.9, which was filed Jan. 21, 2005 and is incorporated herein by reference.

TECHNICAL FIELD

Embodiments of the invention relate to a semiconductor product having a semiconductor substrate and a test structure and further to methods for carrying out an electrical measurement at a semiconductor product having a test structure.

BACKGROUND

Integrated semiconductor memories can be subdivided into volatile and nonvolatile semiconductor categories. In volatile semiconductor memories, the charges stored in the memory cells always have to be refreshed again within a short time since the stored charges are otherwise lost through leakage currents. In nonvolatile semiconductor memories by contrast, stored information items are retained for a long time, typically several years. One type of volatile semiconductor memory is DRAM (dynamic random access memory), the memory cells of which each has a selection transistor and a storage capacitor. The selection transistor is driven by a word line and a bit line. The storage capacitor becomes accessible if the selection transistor is opened by means of applying suitable bias voltages to the bit line and to the word line. In this case, a stored information item is written in or is read out from the storage capacitor. In addition, after the refresh time has elapsed again, the memory contents of the volatile memory cell are always read out again, amplified and written back into the storage capacitor.

The storage capacitors in a DRAM may be formed for instance as trench capacitors or as stacked capacitors. In the case of the trench capacitor, a deep trench is etched into the semiconductor substrate; the trench wall of the deep trench being first covered with a capacitor dielectric and the trench interior of the deep trench later being filled with a conductive material. The latter forms the inner capacitor electrode. The outer capacitor electrode comprises a doped substrate region in the vicinity of the trench. Electrical contact is made with the outer capacitor electrode with the aid of a buried doped layer (buried layer).

An upper region of the capacitor trench is filled with insulating material in order to prevent leakage currents between selection transistors that are to be arranged at the substrate surface and the trench capacitor. In order to make electrical contact with the inner capacitor electrode, a region of the capacitor dielectric is removed at the upper end of the inner capacitor electrode and conductive material is deposited over it, which material directly touches both the inner capacitor electrode and the trench wall. The deposited conductive material is a doped material whose dopants can outdiffuse into the surrounding substrate material during a thermal treatment carried out in a targeted manner. As a result, a diffusion region is produced which, after carrying out the thermal treatment, reaches as far as a source/drain region of the associated selection transistor and overlaps it. The electrical connection between the selection transistor and the inner capacitor electrode is thereby produced.

The region formed by the outdiffused dopants is usually referred to as a buried strap. Present-day semiconductor memories have memory cells in which the buried strap is arranged only on that side of the edge of the trench capacitor, which faces the selection transistor. The size and conductivity of the buried strap can be controlled by means of the dopant concentration of the inner capacitor electrode (or of the doped material that is deposited on it and reaches as far as the trench wall) and also by means of the duration and the temperature of the thermal treatment.

The selection transistor is usually a MOSFET (metal oxide semiconductor field effect transistor), which has two source/drain regions between which an inversion channel region can be formed. Arranged above the inversion channel region is first the gate oxide, and above that, the gate layer stack, including the gate electrode, which forms an interconnect section of the word line. One of the source/drain regions of the selection transistor is connected to the bit line. The other source/drain region of the selection transistor is connected to the inner capacitor electrode of the trench capacitor by the buried strap.

Integrated semiconductor memories are produced by fabricating a multiplicity of the memory circuits on a semiconductor wafer, and subsequently, singulating the semiconductor wafer into memory chips. In this case, the semiconductor wafer is sawn, or severed in some other way, along interspaces formed between respectively adjacent memory circuits, that is to say along lines of a sawing frame (scribe line). The circuits that have already been formed previously on the semiconductor chips are electrically contact-connected and packaged after the singulation of the wafer.

During the production of the integrated semiconductor circuits on the semiconductor wafer, additional semiconductor structures, in particular test structures, which can supply additional information about the quality of the actual memory circuits during an electrical measurement, can be formed in partial regions of the sawing frame. It is possible, for example, to simulate regions of a memory cell array in a test structure that is to be arranged on the sawing frame and to connect the test structure to external connections in such a way that electrical parameters such as, for instance, nonreactive resistances, leakage currents or others can be determined by means of electrical measurements. Such measurements are carried out by a procedure in which, in a manner similar to that during the electrical functional test of the memory circuits, test needles of a test head are placed onto the wafer surface and make contact with the electrical structures formed. Some test needles may be arranged in such a way that, upon emplacement of the test head, they make contact with a test structure arranged in a sawing frame. Thus, it is possible to carry out electrical measurements, which cannot be carried out in the integrated semiconductor circuit itself.

One electrical measurement quantity of interest in the case of a volatile semiconductor memory is the nonreactive resistance of the buried strap between the selection transistor and the trench capacitor. It is not readily measurable in a completed memory cell array since, although information items may be written to the trench capacitor or read out of the trench capacitor via a bit line, the selection transistor and the buried strap measurement currents cannot be conducted through the buried strap without simultaneously flowing via the channel region of the selection transistor. Therefore, it is never possible to measure the nonreactive resistance of the buried strap in isolation, but rather only the sum of the resistances of the buried strap, of the selection transistor, and of the bit line can be measured. Moreover, a measurement of the nonreactive resistance is made more difficult by the fact that the buried strap is electrically accessible only from one side, whereas the other side of the buried strap is connected to the inner capacitor electrode, which is surrounded by insulating material on all sides.

It is also the case in measurements of other electrical parameters at test structures, where the test structures are modeled on the memory cell arrays, that provision necessarily has to be made of the selection transistors in the test structure via which the measurement currents flow. As a result, measurements of the conductivity of other structure elements, for example of the capacitor electrodes, are also inhibited and affected by the nonreactive resistance of the selection transistor. That is, the measurements of other structure elements cannot be made directly, but are made through the conductive paths of the selection transistors and are, therefore, affected by the nonreactive resistance of the selection transistors.

SUMMARY OF THE INVENTION

Embodiments of the invention enable electrical measurements whose measurement results supply information about structure elements of integrated memory cell arrays, but that are not corrupted by the electrical resistance of integrated selected transistors. In particular, the intention is to enable a more precise electrical measurement of the nonreactive resistance of a buried strap or of an inner capacitor electrode. Additional embodiments of the invention provide a semiconductor product, which enables such electrical measurements.

The embodiments achieve advantages by means of a semiconductor product having a semiconductor substrate and a test structure; the test structure having at least one first transistor having a first and a second source/drain region, which are arranged in the semiconductor substrate, an insulation layer and a gate electrode; the gate electrode being isolated from the semiconductor substrate by the insulation layer. The test structure also has at least one trench capacitor having an inner capacitor electrode arranged in a trench, and a dopant diffusion region arranged in the semiconductor substrate, which dopant diffusion region connects the inner capacitor electrode to the first source/drain region. The test structure further comprises at least one first interconnect, and at least one first contact connection connected to the first interconnect, wherein the first contact connection makes contact with the first source/drain region of the first transistor, and the source/drain region is connected to the inner capacitor electrode by the dopant diffusion region.

Embodiments of the invention provide a semiconductor product having a test structure, in which a contact connection makes contact by means of an interconnect with that source/drain region of the transistor, which is conductively connected to the inner capacitor electrode by the dopant diffusion region. Conventionally, test structures are always constructed such that, in a selection transistor, one source/drain region is connected to an interconnect, whereas the other source/drain region is connected to the inner capacitor electrode. The electrical connection of the one source/drain region to the interconnect is usually produced by a contact connection arranged on this source/drain region. The electrical connection of the other source/drain region to the inner capacitor electrode is produced by the dopant diffusion region, that is to say, the buried strap. Thus, in each case, the buried strap and the contact connection thus in each case make contact with two source/drain regions of a selection transistor, which are separated from one another by the channel region. Therefore, measurement currents can conventionally flow only via the channel region of the selection transistor, whereby electrical measurements are corrupted on account of the channel resistance of that transistor.

According to preferred embodiments of the invention, by contrast, that source/drain region, which is connected to the inner capacitor electrode by the buried strap, is simultaneously also conductively connected to the interconnect. This may be done for example with the aid of a contact connection that is produced as in the conventional manner. However, this contact connection is advantageously arranged on the source/drain region connected to the inner capacitor electrode, as a result of which this first source/drain region is simultaneously connected to the interconnect. The interconnect serves for the electrical driving of the dopant diffusion region within the test structures and corresponds to a bit line of a memory cell array with regard to choice of material and with regard to other properties.

In the case of the test structure provided in the semiconductor product of embodiments of the invention, the first interconnect is conductively connected by the contact connection to the capacitor-side source/drain region, namely the first source/drain region. The latter is connected to the inner capacitor electrode by the dopant diffusion region. Consequently, the current path no longer leads via the channel region of the transistor; the transistor is electrically functionless and serves only to form, in the vicinity of the buried strap, structural surroundings similar to those in the memory cell array of an integrated semiconductor circuit. In a preferred embodiment, the buried strap is connected directly to the first interconnect via the contact connection and the first source/drain region and can be electrically driven via the interconnect. With use of the preferred embodiments of the invention, electrical measurements of the nonreactive resistance of the buried strap thereby become possible, and now this measurement result is not corrupted by the electrical resistance of the prior art selection transistor, in particular of its inversion channel. It is thereby possible to check, more reliably, whether the buried strap produces a sufficiently low-resistance connection between the capacitor-side source/drain region and the inner capacitor electrode of the trench capacitor.

In another preferred embodiment, the first contact connection is a contact hole filling arranged on the first source/drain region. In the selection transistors of a memory cell array and the corresponding transistors of test structures, such a contact hole filling is conventionally arranged on that source/drain region, which is opposite to that source/drain region, which is connected to the inner capacitor electrode by the buried strap.

Furthermore, it is preferably provided in an additional embodiment that the first contact connection short-circuits the first interconnect directly with the first source/drain region. Since the contact connection is conductive and the first source/drain region is heavily doped in the current path leading from the first interconnect through the contact connection, the first source/drain region and the dopant diffusion region as far as the inner capacitor electrode, the nonreactive resistance is principally determined by the nonreactive resistance of the dopant diffusion region and by the extent to which the dopant diffusion region spatially overlaps the first source/drain region. Therefore, a more direct measurement of the resistance of the dopant diffusion region is possible than was the case of a prior art current path, which additionally leads via a transistor channel, which is necessarily included in the measurement.

In one preferred embodiment, the test structure, furthermore, has a second transistor having a first and a second source/drain region which are arranged in the semiconductor substrate, the second transition also having an insulation layer and a gate electrode, the gate electrode being isolated from the semiconductor substrate by the insulation layer. This embodiment also includes a further dopant diffusion region arranged in the semiconductor substrate, which further dopant diffusion region conductively connects the inner capacitor electrode to the first source/drain region of the second transistor. The embodiment further includes a second interconnect and a second contact connection connected to the second interconnect.

In this preferred embodiment, the trench capacitor has two dopant diffusion regions, one of which is connected to the first transistor and the other of which is connected to the second transistor. This arrangement opens up a current path, which leads via two dopant diffusion regions and the inner capacitor electrode, but not via a transistor channel. The advantage of a second dopant diffusion region connected to the inner capacitor electrode consists in the fact that that part of the current path, which leads via the further dopant diffusion region constitutes a second capacitor connection, which conducts away a current flowing into the trench capacitor via the first dopant diffusion region. Consequently, unlike conventional practice, the inner capacitor electrode is no longer situated at the end of a current path, but rather can be simultaneously contact-connected at two locations with the aid of two electrical connections. As a result, a current can be conducted through the inner capacitor electrode and the conductivity of the dopant diffusion regions can be determined by measuring the current intensity or the non-reactive resistance. In particular, static currents can be conducted through the dopant diffusion regions and the inner capacitor electrode over longer periods of time. This is not possible in memory cells of a memory cell array, because a current flow into the memory cell or out of the latter only occurs momentarily during the charge reversal of the trench capacitor.

In accordance with another preferred embodiment, the second contact connection makes contact with the first source/drain region of the second transistor, the source/drain region being connected to the inner capacitor electrode by the further dopant diffusion region. In this case, circuitry-symmetrical contact is made with the inner capacitor electrode with the aid of two dopant diffusion regions. In both transistors, that source/drain region, which is conductively connected to the inner capacitor electrode by one of the two diffusion regions, is in each case conductively connected to the respective interconnect by a contact connection. The current path leads from the first interconnect via the first contact connection, the first source/drain region of the first transistor, the dopant diffusion region, the inner capacitor electrode, the further dopant diffusion region, the first source/drain region of the second transistor, and via the second contact connection through to the second interconnect. If electrical potentials of different magnitudes are applied to the first and second interconnects, the electrical resistance of the current path can be determined. In neither of the two transistors does the current path lead via a channel region. Consequently, the sum of the nonreactive resistances of the dopant diffusion region and of the further dopant diffusion region can be measured directly.

In accordance with an alternative embodiment, the second contact connection makes contact with the second source/drain region of the second transistor. The second source/drain region of the second transistor is opposite to that source/drain region of the second transistor, which is connected to the inner capacitor electrode by the further dopant diffusion region. In this case, the current path leads between the first and second interconnects via the transistor channel of the second transistor. As a result, measurements in which the total electrical resistance that usually occurs between the bit line contact and the inner capacitor electrode in a memory cell can be measured are also possible. The electrical measurement can be carried out in particular with the aid of a static measurement current, which can be maintained over significantly longer periods of time than the time period customarily available for the charge reversal of a storage capacitor.

In another preferred embodiment, the dopant diffusion regions of the test structure may be formed with such low resistance that during the measurement in accordance with this alternative embodiment, essentially solely the electrical resistance of the transistor channel of the second transistor is measured.

In accordance with the embodiments above, it is thus provided that the first and the second transistor are connected to the same trench capacitor by the dopant diffusion region and the further dopant diffusion region.

With regard to the geometry of the trench capacitor, in yet another embodiment it is preferably provided that the first and the second interconnect run parallel to one another, that the first transistor is arranged in a first region of the semiconductor substrate, the first region being covered by the first interconnect, and the second transistor is arranged in a second region of the semiconductor substrate, the second region being covered by the second interconnect, and that, in the direction transversely with respect to the course of the two interconnects, the trench capacitor has a width such that it extends from the first region of the semiconductor substrate as far as the second region of the semiconductor substrate. Consequently, the geometry of the trench capacitor provided here differs from conventional trench capacitors, which have only a single electrical connection, namely that toward the selection transistor. In the embodiment described here, the trench capacitor extends from a first substrate region below the first interconnect as far as a second substrate region below the second interconnect, and thus, has a width that is greater than in the case of trench capacitors of volatile memory cells.

If the width of the first and second interconnects and their distance between one another correspond to the structure width of the associated interconnect plane, then the width of the trench capacitor perpendicular to the course of the interconnects is at least triple the structure width if the first and second interconnects are interconnects that are directly adjacent to one another in the interconnect plane. It is accordingly provided that in at least one direction running parallel to the surface of the semiconductor substrate and transversely with respect to the course of the two interconnects, the trench capacitor has an extent greater than triple the width of the first interconnect. If the first and second interconnects are next but one adjacent interconnects between which only a single further interconnect runs, the width of the trench capacitor is at least five times the structure width. In practice, the trench capacitor will additionally project toward both sides of the first and second interconnects. In another embodiment, first and second interconnects may also be arranged at a larger distance from one another, so that a plurality of further interconnects run between them. A particularly large distance between the first and second interconnects and a correspondingly larger width of the trench capacitor in the lateral direction perpendicular to the course of the interconnects may be advantageous particularly in measurements of the nonreactive resistance of the inner capacitor electrode itself. In all cases, however, the trench capacitor need only be wider in a single lateral direction than trench capacitors arranged in conventional memory cell arrays, so that, without excessively great modifications, the test structure is essentially modeled on the memory cell array of a volatile semiconductor memory.

In the embodiments described above, it is provided, in particular, that the trench capacitor is arranged with its lateral main extending direction oriented transversely with respect to the course of the first and second interconnects in the semiconductor substrate. As a result, the respective transistor, the respective dopant diffusion region and the trench capacitor may be arranged successively in a direction parallel to the course of the interconnects in the substrate.

In other preferred embodiments, the dopant diffusion region and the further dopant diffusion region are arranged at an outer edge of the trench capacitor on the same side of the trench capacitor.

Furthermore, in the above embodiments, it is provided that the inner capacitor electrode connects the dopant diffusion region to the further dopant diffusion region. In this case, the current path during an electrical measurement always leads via the dopant diffusion region, the inner capacitor electrode and the further dopant diffusion region. If the electrical resistance of the inner capacitor electrode is negligible, a measurement of the electrical resistance along this current path yields double the nonreactive resistance of a dopant diffusion region.

Furthermore, in additional embodiments the first source/drain region of the first transistor and the first source/drain region of the second transistor are connected to one another in low-resistance fashion by the dopant diffusion region, the inner capacitor electrode and the further dopant diffusion region.

A further embodiment of the invention provides for the test structure to have a first and a second exposed area contact, the first interconnect being connected to the first area contact and the second interconnect being connected to the second area contact. The area contacts may be bonding pads, for example, which can be electrically contact-connected with the aid of contact needles of a contact head. Consequently, the test structure provided according to these embodiments can be tested while a contact head is placed onto an adjacent integrated semiconductor circuit in order to perform an electrical functional test.

Another preferred embodiment provides for the semiconductor product, furthermore, to have at least one integrated memory circuit having a multiplicity of storage capacitors, selection transistors, word lines and bit lines; the first and the second interconnect of the test structure being arranged in the same interconnect plane as the bit lines of the integrated memory circuit. Thus, the test structure provided according to this embodiment of the invention can be used to check the quality of an integrated memory circuit arranged on the same semiconductor substrate. In particular, by means of electrical measurements at the test structure, it is possible to determine the conductivity of dopant diffusion regions (buried straps), which are present in the integrated memory circuit and produce the electrical connections there between the storage capacitor and the selection transistor.

The design of the novel test structure described in the embodiments herein enables a more precise and more easily accessible measurement of the conductivity and of the nonreactive resistance of the buried strap. Such a measurement is no longer possible in the memory cell array of an integrated memory circuit itself after the completion thereof, since the storage capacitors are electrically accessible only from one side, and each current path leading via a buried strap of a memory cell simultaneously also leads via the channel region of the respective selection transistor. Furthermore, the individual memory cells can only be driven by spatially extended bit lines, which corrupt the electrical signals on account of their large interconnect length. Finally, in a conventional memory cell array, it is not possible to affect a static measurement with measurement currents, which are maintained significantly longer than during a charge reversal operation of a storage capacitor.

In yet another preferred embodiment, the test structure has a regular arrangement of transistors, further trench capacitors and interconnects, which are modeled on the integrated memory circuit. Only the trench capacitor that is connected by the dopant diffusion region to a source/drain region of the first transistor and, if appropriate, also via the further dopant diffusion region to a source/drain region of a second transistor, need be wider in at least one lateral direction than the storage capacitors arranged in memory cell arrays. Furthermore, the source/drain regions of the two transistors that are connected to the inner capacitor electrode with low resistance by the dopant diffusion regions are connected to the first and second interconnects by contact connections, and not those source/drain regions that are opposite to the source/drain regions. Moreover, the inner construction of the test structure provided according to this embodiment, however, is essentially identical to the inner construction of a memory cell array and enables meaningful conclusions to be drawn about the electrical behavior of the structure elements, such as buried straps for example, which are present in a memory cell array and cannot be electrically checked directly. It is preferably provided that the test structure is arranged in a sawing frame of the semiconductor substrate, which sawing frame (scribe line) in each case individually surrounds a multiplicity of integrated memory circuits. In particular, the semiconductor product of this embodiment may also have a multiplicity of test structures having the design described here. By way of example, a test structure may in each case be arranged alongside each integrated semiconductor circuit of the semiconductor substrate in order also to detect inhomogeneous design deviations over the wafer area.

The first and the second interconnect are preferably bit lines, in particular, the lines that are arranged in the same interconnect plane as the bit lines of the memory cell arrays of the integrated memory circuits. In particular, the first and second interconnects are arranged in the first interconnect plane above the course of the word lines.

With regard to the ratio of the width of the trench capacitor connected to the first transistor and of further trench capacitors of the test structure, it is preferably provided that in at least one lateral direction parallel to the surface of the semiconductor substrate, the trench capacitor connected to the first transistor has an extent, which is at least double the extent of the further trench capacitors in this direction.

Another preferred embodiment of the invention provides for the test structure, furthermore, to have a third transistor having a first source/drain region, a third dopant diffusion region arranged in the semiconductor substrate, which third dopant diffusion region connects the inner capacitor electrode to the first source/drain region of the third transistor, a third interconnect, and a third contact connection, which is connected to the third interconnect and makes contact with the first source/drain region of the third transistor.

With three electrical connections to the inner capacitor electrode, it is then possible to carry out an electrical multipoint measurement. In particular, it is possible to perform measurements simultaneously on two current paths that branch proceeding from a common connection. The common part of the two current paths may in particular be arranged in the center between two of the dopant diffusion regions and contain a third dopant diffusion region.

Another preferred embodiment of the invention provides for the test structure, furthermore, to have a fourth transistor having a first source/drain region, a fourth dopant diffusion region arranged in the semiconductor substrate, which fourth dopant diffusion region connects the inner capacitor electrode to the first source/drain region of the fourth transistor, a fourth interconnect, and a fourth contact connection, which is connected to the fourth interconnect and makes contact with the first source/drain region of the fourth transistor.

The four electrical connections to the inner capacitor electrode of the above preferred embodiment enable, in particular, a measurement of the nonreactive resistance of an inner capacitor electrode having a particularly large lateral extent in the direction transversely with respect to the course of the first and second interconnects. In each case, two of the dopant diffusion regions may be arranged at the two opposite ends of the trench capacitor. Thus, it is possible to carry out measurements simultaneously on two current paths, which in each case lead over a large part of the trench length of the trench capacitor in the direction transversely with respect to the course of the interconnects. The large extent of the trench capacitor facilitates a precise measurement of the resistance of the inner capacitor electrode.

A preferred embodiment of the invention provides a method for carrying out an electrical measurement at a test structure of a semiconductor product having the steps of providing a semiconductor product having a test structure in accordance with one of the embodiments described above, and connecting the first interconnect to a first potential connection and connecting the second interconnect to a second potential connection and biasing the first and the second potential connection in such a way that a current having a predetermined current intensity flows from the first potential connection via the test structure to the second potential connection.

Preferably, in the first step, a semiconductor product is provided having three dopant diffusion regions and three interconnects as described above, in which the second interconnect is arranged between the first interconnect and the third interconnect, and in which the distance between the first and second interconnects is equal in magnitude to the distance between the second and third interconnects; and in the second step, a respective connection of a voltmeter is furthermore connected to the second and the third interconnect, and that a voltage drop between the second and the third interconnect is measured.

One current path runs between the first and second interconnects and the other current path runs between the third and second interconnects. The two current paths run mirror-symmetrically with respect to one another and have the same nonreactive resistance. The current intensity is prescribed by one current path and the voltage that occurs is measured on the other current path. The quotient yields the nonreactive resistance along one of the current paths.

It is further preferably provided that a semiconductor product is provided having four dopant diffusion regions and four interconnects, in which the third and the fourth interconnect are arranged between the first and the second interconnect, the distance between the third interconnect and the first interconnect being equal in magnitude to the distance between the fourth interconnect and the second interconnect, and in a second step, a respective connection of a voltmeter is furthermore connected to the third and the fourth interconnect, and a voltage drop between the third and the fourth interconnect is measured.

The first and third interconnects may be arranged at a first lateral end of the trench capacitor and the second and fourth interconnects may be arranged at a second, opposite end of the trench capacitor. In this case, when the two respective interconnects are at the same distance from one another, this likewise gives rise to a mirror-symmetrical construction, one current path runs from the first as far as the second interconnect and the other current path runs from the third as far as the fourth interconnect. The respective dopant diffusion region is arranged below each interconnect. The two current paths run along the main extending direction of the trench capacitor, which is directed transversely with respect to the interconnect course of the interconnects. In particular, this preferred embodiment enables an electrical four-point measurement.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 6 shows a schematic cross-sectional view of the test structure of FIG. 5 along the sectional line BB;

FIG. 7 shows a further schematic plan view of the test structure of FIGS. 5 and 6;

FIG. 8 shows a further preferred embodiment of another test structure, illustrated as in FIG. 6;

FIG. 9 shows a schematic plan view of the test structure from FIG. 8;

The following list of reference symbols can be used in conjunction with the figures:

| | |
|---|---|
| 1 | Semiconductor product |
| 2 | Semiconductor substrate |
| 5 | Test structure |
| 7 | Storage capacitor |
| 8 | Memory cell array |
| 9 | Integrated memory circuit |
| 10 | First transistor |
| 10a | Selection transistor |
| 11, 21, 61, 71 | First source/drain region |
| 12, 22 | Second source/drain region |
| 13, 23 | Insulation layer |
| 14, 24 | Gate electrode |
| 14a | Word line |
| 14b | Further word line |
| 15 | Dopant diffusion region |
| 16 | First interconnect |
| 16a | Bit line |
| 16b | First region of the semiconductor substrate |
| 17 | First contact connection |
| 18 | First area contact |
| 19 | Second area contact |
| 20 | Second transistor |
| 25 | Further dopant diffusion region |
| 26 | Second interconnect |
| 26a | Second region of the semiconductor substrate |
| 27 | Second contact connection |
| 30 | Trench capacitor |
| 31 | Inner capacitor electrode |
| 32 | Capacitor dielectric |
| 33 | Insulating material |
| 34 | Outer edge |
| 36 | Further interconnect |
| 37 | Further contact connection |
| 40 | Further trench capacitor |
| 45 | Arrangement |
| 60 | Third transistor |
| 65 | Third dopant diffusion region |
| 66 | Third interconnect |
| 67 | Third contact connection |
| 70 | Fourth transistor |
| 75 | Fourth dopant diffusion region |
| 76 | Fourth interconnect |
| 77 | Fourth contact connection |
| a | Dimension |
| AA; BB | Sectional line |
| I | Current |
| V1 | First potential connection |
| V2 | Second potential connection |
| V+, V− | Connection of a voltmeter |
| x, y, z | Directions |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
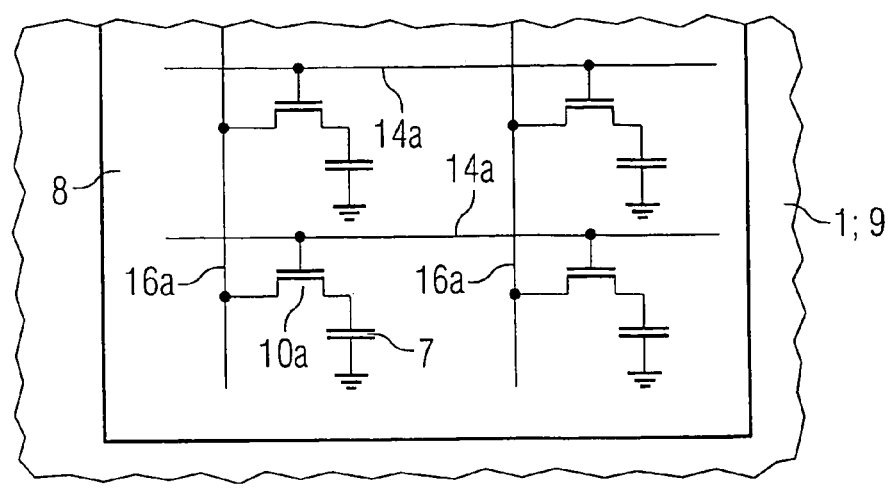
FIG. 1 shows a schematic plan view of a memory cell array of an integrated memory circuit.

FIG. 1 shows an integrated memory circuit 9 of a semiconductor product 1, which has a memory cell array 8. The memory cell array 8 contains a multiplicity of volatile memory cells each having selection transistors 10a and storage capacitors 7. The selection transistors are connected to bit lines 16a and word lines 14a. The electrical connection between the selection transistors and the trench capacitors is produced by dopant diffusion regions, so-called buried straps.

Figure 2:
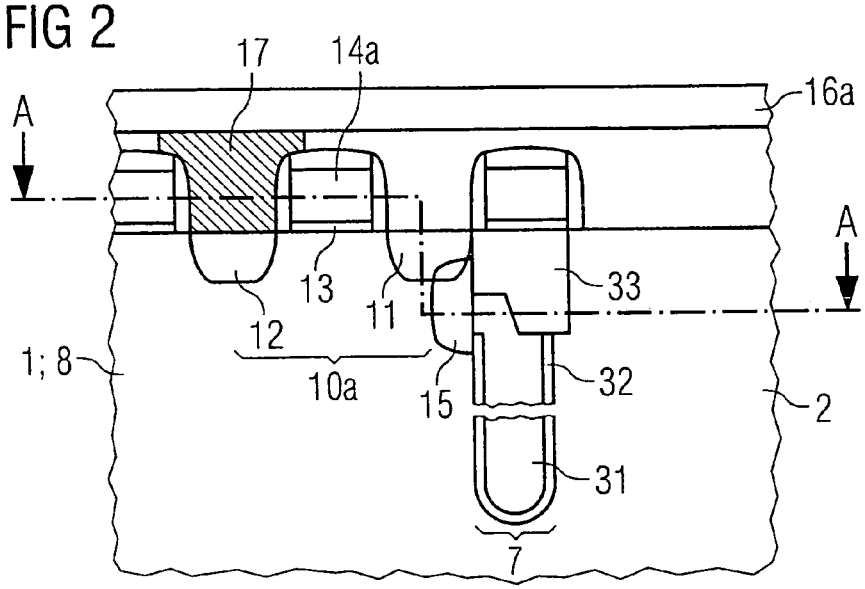
FIG. 2 shows a cross-sectional view of a memory cell of the memory circuit from FIG. 1.

FIG. 2 shows a schematic cross section through a volatile memory cell of the memory cell array 8 from FIG. 1. The memory cell contains a storage capacitor 7 arranged in the semiconductor substrate 2, the storage capacitor having a capacitor dielectric 32 arranged at the trench wall of a capacitor trench, and an inner capacitor electrode 31, which fills the interior of the trench within the capacitor dielectric 32 and reaches at least in regions, namely at the left-hand upper end in FIG. 2, directly as far as the trench wall. Adjoining the latter location there is situated in the semiconductor substrate 2, the dopant diffusion region 15 produced by outdiffusion of dopants contained in the material of the inner capacitor electrode 31 during a thermal treatment in the course of the production of the semiconductor product. Above the inner capacitor electrode, the trench is insulated toward the substrate surface by an insulating material 33. The trench capacitor, furthermore, has an outer capacitor electrode (not illustrated) with which electrical contact can be made by a doped layer (buried layer) buried in the semiconductor substrate 2.

The selection transistor 10a of the memory cell has a first source/drain region 11, a second source/drain region 12, an insulation layer 13, namely the gate oxide, and a gate electrode representing an interconnection section of the word line 14a. The first source/drain region 11 spatially overlaps the dopant diffusion region 15, which produces the electrical connection of the selection transistor to the inner capacitor electrode 31. The other, second source/drain region 12 is connected to the bit line 16a by a contact connection 17.

Figure 3:
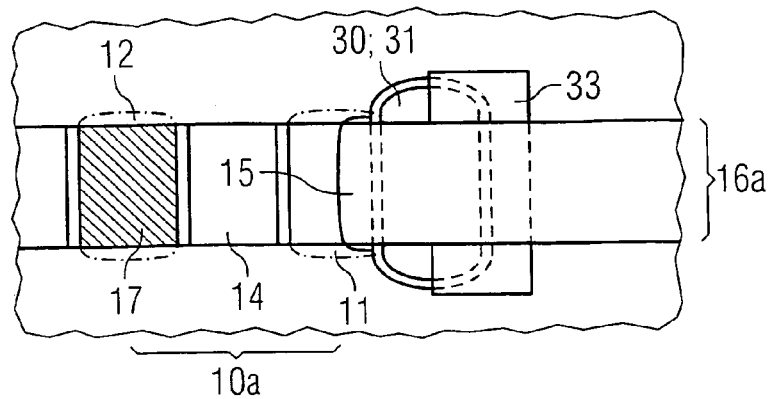
FIG. 3 shows a schematic plan view of the memory cell in accordance with FIG. 2.

FIG. 3 shows the memory cell illustrated in FIG. 2 in plan view, to be precise at the level of the sectional line AA from FIG. 2. This is arranged at the level of the gate layer stack in the left-hand half of FIG. 2 and at the level of the dopant diffusion region 15 in the right-hand half of FIG. 2. In FIG. 3, the trench capacitor 30, having the inner capacitor electrode 31, can be discerned below the bit line 16a, the insulating material 33 that insulates the trench capacitor toward the substrate surface being illustrated only above the right-hand half of the trench capacitor 30. On the left in FIG. 3, the selection transistor 10a having the gate electrode 14 and the two source/drain regions 11, 12 can be discerned below the bit line 16a. The source/drain regions are bordered by dash-dotted lines. The contact connection 17 is hatched for the sake of clarity and overlapping over the adjacent word lines is illustrated. The dopant diffusion region 15 extends on the left-hand side of the capacitor trench 30, which dopant diffusion region connects the capacitor-side source/drain region 11 to the inner capacitor electrode 31 with low resistance.

The contact connection 17 is connected to the opposite, second source/drain region 12. In the case of this conventional construction of a memory cell, the nonreactive resistance of the dopant diffusion region 15 is not individually measurable since the current path leading through the dopant diffusion region 15 simultaneously also leads via the transistor channel. Moreover, currents can be conducted through the dopant diffusion region 15 only momentarily, namely during a charge reversal operation of the trench capacitor 30.

Figure 4:
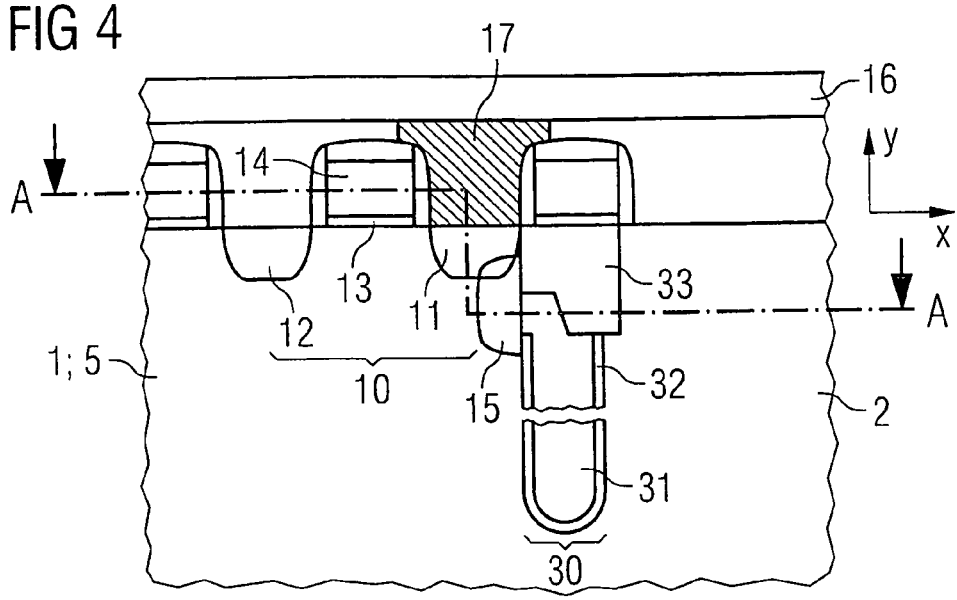
FIG. 4 shows a cross-sectional view of a test structure provided according to one preferred embodiment of the invention.

FIG. 4 shows a schematic cross-sectional view through a test structure of a semiconductor product according to a first preferred embodiment of the invention. The test structure differs in the cross-sectional view of FIG. 4 from the cross-sectional view of a volatile memory cell by virtue of the fact that in the test structure, according to this embodiment of the invention, the contact connection 17 is arranged on that source/drain region 11, which is conductively connected to the inner capacitor electrode 31 of the trench capacitor 30 by the dopant diffusion region 15. As a result, this source/drain region 11 is simultaneously connected to the first interconnect 16 running outside the surface of the semiconductor substrate 2. By contrast, the second source/drain region 12 is not contact-connected. The test structure 5 of the semiconductor product 1 according to the embodiment of the invention that is arranged in FIG. 4, thus, has a trench capacitor 30 and a first transistor 10, which are connected to the first contact-connection 17 in parallel with one another (instead of serially). Although outwardly largely identical to the memory cell in accordance with FIG. 2, this arrangement of the first transistor 10 and the trench capacitor 30 is not suitable as a memory cell, but rather is part of a test structure, which is arranged outside the memory cell array 8 from FIG. 1 in the semiconductor product 1 according to this embodiment. The test structure is in particular arranged in the sawing frame (scribe line) of the semiconductor substrate 2 and largely modeled on the memory cell array 8 of the integrated memory circuit 9. In the test structure depicted in FIG. 4, a current path leads from the first interconnect 16 via the first contact connection 17, via the first source/drain region 11 of the first transistor 10 and the dopant diffusion region 15 directly to the inner capacitor electrode 31 of the trench capacitor 30. In this current path, an electrical measurement of the nonreactive resistance of the dopant diffusion region 15 is possible, which is not corrupted by the nonreactive resistance of the inversion channel of a transistor 10, as in measurements made in conventional memory devices.

Figure 5:
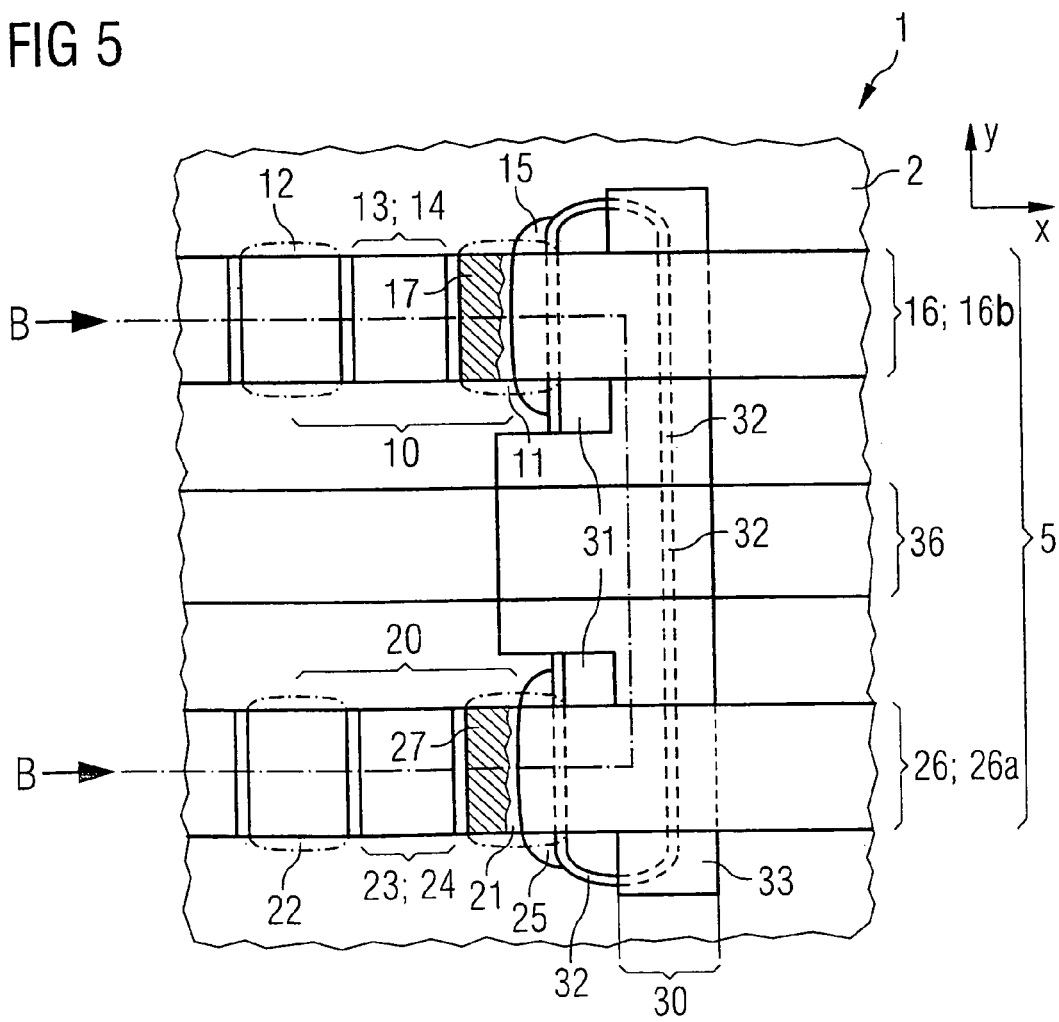
FIG. 5 shows a schematic plan view of the test structure in accordance with another preferred embodiment of the invention.

FIG. 5 shows a test structure according to another preferred embodiment of the invention. This is illustrated in plan view in FIG. 5; the cross-sectional view simultaneously corresponds to the illustration of FIG. 4, but two interconnects and two transistors and also a widened trench capacitor 30 are provided in the developed embodiment of FIG. 5. The plan view of FIG. 5 is illustrated along the sectional line AA from FIG. 4. The sectional line runs at the level of the dopant diffusion region 15 and the inner capacitor electrode 31 in the right-hand half of FIG. 4. The sectional line AA runs at the level of the gate electrode 14 in the left-hand half of FIG. 4.

FIG. 5 illustrates a trench capacitor 30 having a much greater dimensioning in the direction y perpendicular to the course of the first 16 and a second interconnect 26 than trench capacitors arranged in conventional memory cells. The trench capacitor 30 of the test structure according to the embodiment of the invention extends from a region 16b of the semiconductor substrate 2, which region is covered by the first interconnect 16, as far as a second region 26a of the semiconductor substrate 2, which second region is covered by the second interconnect 26. In the direction x of the course of the interconnects 16, 26, by contrast, it has the same dimensioning as the storage capacitors of memory cells. The trench capacitor illustrated in FIG. 5 is covered by an insulating material 33 on a right-hand side and in a region between the two interconnects 16, 26. The inner capacitor electrode 31 and the capacitor dielectric 32 can be discerned in the regions that are not covered. Furthermore, the dopant diffusion region 15 is formed in the first region 16b of the semiconductor substrate 2, which dopant diffusion region connects the inner capacitor electrode 31 conductively, or at least with low resistance, to the first source/drain region 11 of the first transistor 10. Furthermore, a further dopant diffusion region 25 is illustrated in the second region 46 of the semiconductor substrate 2, which further dopant diffusion region connects the inner capacitor electrode 31 to a source/drain region 21 of a second transistor 20. FIG. 5, furthermore, illustrates the second source/drain region 12 of the first transistor 10, the gate electrode 14 of the first transistor 10, the second source/drain region 22 of the second transistor 20 and the gate electrode 24 thereof. The extent of the source/drain regions 11, 12, 21, 22 in the direction x along the course of the interconnects 16, 26 is illustrated by dash-dotted lines. Furthermore, the first source/drain region 11 of the first transistor 10 is connected to the first interconnect 16 by the first contact connection 17 and the first source/drain region 21 of the second transistor 20 is connected to the second interconnect 26 by a second contact connection 27. The contact connections 17, 27 arranged on the first, capacitor-side source/drain regions 11, 21 open up a current path, which runs between the first 16 and the second interconnect 26 without leading via an inversion channel of a transistor. As a result, it is possible to make electrical measurements of the nonreactive resistance of the dopant diffusion regions 15, 25, which are not corrupted by channel resistances of transistor.

FIG. 6 shows a cross-sectional view of the test structures from FIG. 5 along the sectional line BB. In FIG. 5 this sectional line has two reversal points at which the direction of the sectional line BB changes by 90 degrees. In the cross-sectional view of FIG. 6, the reversal points correspond to the broken lines C. The left-hand third of the cross-sectional view of FIG. 6 runs along the course of the first interconnect 16 and the right-hand third of the cross-sectional view from FIG. 6 runs along the course of the second interconnect 26. By contrast, a middle region of the cross-sectional view of FIG. 6 arranged between the two lines C runs in the direction y (FIG. 5) transversely with respect to the course of the interconnects 16, 26. The trench capacitor 30 widened in the y direction can clearly be discerned in this region. Its depth extent is illustrated in interrupted fashion for space reasons. Its depth is similar to the depth of storage capacitors, which are contained in memory cells and have an aspect ratio of typically 50 or greater. In the middle of FIG. 6, a further interconnect 36 is illustrated in cross section above the trench capacitor 30 and the insulating material 33, the further interconnect also running between the first interconnect 16 and the second interconnect 26 in FIG. 5. The left-hand and right-hand thirds of the cross-sectional view of FIG. 6 show mutually mirror-inverted cross sections of the test structure along the first 16 and the second interconnect 26. The mirror-inverted illustration results from the fact that the direction of the respective horizontal sections of the sectional line BB is reversed in FIG. 5.

The current path between the first interconnect 16 and the second interconnect 26, which current path is opened up by the test structure provided according to the embodiment of the invention, can be discerned even more clearly in FIG. 6 than in FIG. 5. The current path runs from the first interconnect 16 via the first contact connection 17, the first source/drain region 11 of the first transistor 10, the dopant diffusion region 15, the inner capacitor electrode 31, the further dopant diffusion region 25, the first source/drain region 21 of the second transistor 20 and via the second contact connection 27 as far as the second interconnect 26. This current path contains no inversion channel; the two transistors 10, 20 have no circuitry function since the respective second source/drain regions 12, 22 are not electrically connected. If a first electrical potential V1 is applied to the first interconnect 16 and a second electrical potential V2 different from the first potential V1 is applied to the second interconnect 26, then a current that can be utilized for measuring the resistance of the two dopant diffusion regions 15, 25 flows along the current path. In actual fact, although the sum of the nonreactive resistances of the two diffusion regions 15, 25 and of the inner capacitor electrode 31 arranged between them is measured, if the inner capacitor electrode 31 is sufficiently heavily doped, the measured nonreactive resistance approximately corresponds to double the nonreactive resistance of one of the two dopant diffusion regions 15, 25. If, on the other hand, the dopant diffusion regions are formed with very low resistance and the inner capacitor electrode 31 extends in the direction y across a very much larger number of further interconnects 26, the measured resistance of the current path will largely correspond to the sheet resistance of the inner capacitor electrode, which can be utilized for a measurement of the sheet resistance of the inner capacitor electrode 31.

FIG. 7 shows a further plan view of the development of the test structure in accordance with FIG. 5, FIG. 7 additionally illustrating the surroundings of the trench capacitor 30. The main extending direction y, which is oriented transversely with respect to the course of the two interconnects 16, 26, runs horizontally in FIG. 7. The first interconnect 16 and the second interconnect 26 and also further interconnects 36 run vertically in FIG. 7. It can be discerned that, in the exemplary embodiment of FIG. 7, the trench capacitor 30 has along its main extending direction y, a dimension a encompassing a width of five interconnects 36 adjacent to one another. FIG. 7, furthermore, illustrates the word line 14a, which forms the gate electrodes of the first and second transistors (not illustrated in FIG. 7), and further word lines 14b. Moreover, further contact connections 37 are illustrated, which cover the respectively adjacent word lines on both sides in the direction x, as also illustrated in the cross-sectional view of FIG. 6. In the plan view of FIG. 7, the first contact connection 17 and the second contact connection 27 overlap the trench capacitor 30 since they are in each case connected to capacitor-side source/drain regions, which are connected to the inner capacitor electrode 31 by the two dopant diffusion regions. As can be discerned in FIG. 7, the test structure 5 is largely modeled on a memory cell array, for example the memory cell array 8 of the integrated memory circuit 9 from FIG. 1. FIG. 7 thus shows an arrangement 45 having a multiplicity of further trench capacitors 40, further interconnects 36, further word lines 14b and further contact connections 37. On account of the similarity of the arrangement 45 to a memory cell array 8 as in FIG. 1, conclusions from electrical measurements that are performed at the test structure 5 can largely be transferred to the memory cell array 8 of the integrated memory circuit 9 (FIG. 1). Consequently, measurements, which are not possible in the memory cell array 8 itself, can be carried out in the test structure.

FIG. 8 shows a cross-sectional view of a test structure in accordance with a further embodiment of the semiconductor product according to the invention. The mode of illustration of the cross-sectional view of FIG. 8 corresponds to the mode of illustration of FIG. 6; in FIG. 8 as well, the cross-sectional view runs according to a section line BB as in FIG. 5. Compared with FIG. 5, however, the position of the second contact connection 27 is altered. The latter is situated not above the first 21 but above the second source/drain region 22 of the second transistor 20. Consequently, between the first 16 and the second interconnect 26 a current path is opened up, which, although it leads from the first contact connection 17 via the first source/drain region 11 of the first transistor 10 directly via the dopant diffusion region 15, additionally runs via the second source/drain region 22 of the second transistor 20 and via the channel region of the second transistor 20 on the side of the further dopant region 25 and the second transistor 20.

The test structure of FIG. 8 is intended, for example, to measure the nonreactive resistance of a memory cell without the measurement result being corrupted by an inversion channel of the first transistor 10 additionally connected in series. The first source/drain region 11, which is connected directly to the dopant diffusion region 15 and also to the first contact connection 17, enables a measurement of the nonreactive resistance of the memory cell formed from the trench capacitor 30 and the second transistor 20, to be precise also with the aid of a static measurement current, which can be maintained significantly longer than is otherwise possible during the charge reversal of a storage capacitor of volatile memory cells.

FIG. 9 shows a plan view of the test structure in accordance with FIG. 8, the illustration once again showing, in a manner similar to that in FIG. 7, the surroundings of the trench capacitor 30, namely in particular the further interconnects 36, the further word lines 14b and the further contact connections 37. The first and second interconnects 16, 26 are directly adjacent to one another, as can be discerned in FIG. 9. Consequently, the sectional line BB does not lead via further interconnects in the region running in the direction y, that is to say perpendicular to the interconnects 16, 26. The region of the cross-sectional view along the course of the first interconnect 17 illustrated on the left in FIG. 8 corresponds to the right-hand vertical section of the sectional line BB of FIG. 9. The region of the cross-sectional view that runs on the right along the second interconnect 26 in FIG. 8 corresponds to the left-hand vertical section of the sectional line BB in FIG. 9. It can be discerned that in FIG. 9 the second contact connection 27, in the same way as in FIG. 8, is arranged at a greater distance from the capacitor trench 30 than the first contact connection 17. The further trench capacitors are not illustrated in FIG. 9 for the sake of clarity, but they are formed in a manner similar to that in FIG. 7 and are as wide as in FIG. 7 in particular in the direction y transversely with respect to the course of the interconnects 16, 26, 36.

Figure 10:
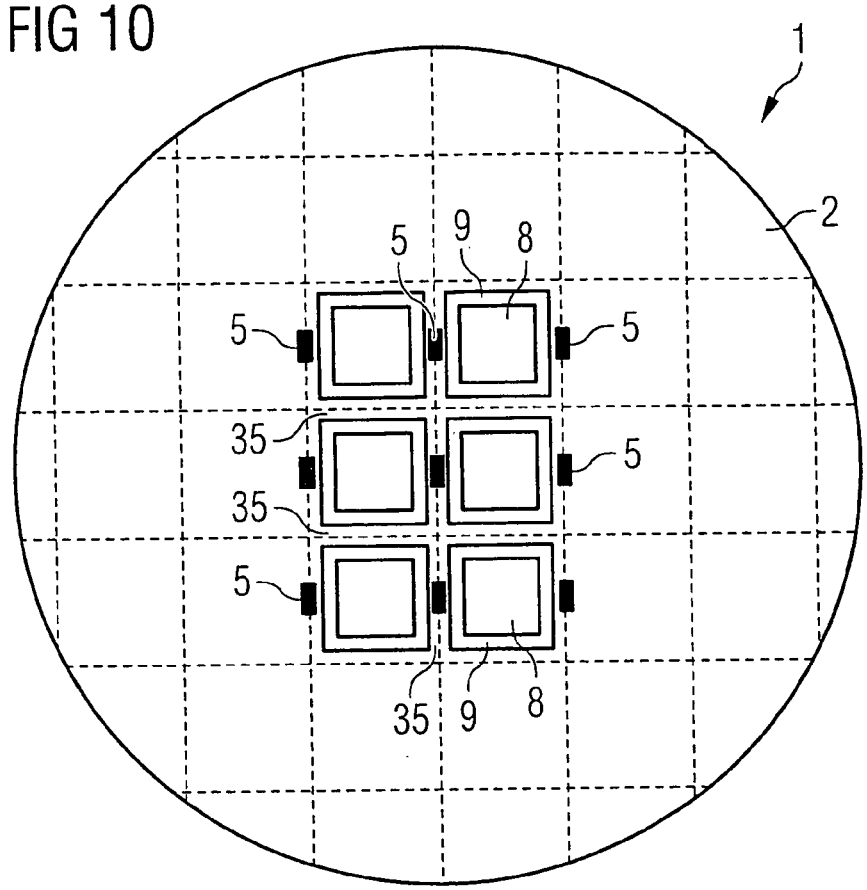
FIG. 10 shows a plan view of a semiconductor product having test structures and having integrated memory circuits.

FIG. 10 shows a plan view of a semiconductor product, which has a semiconductor wafer 2 having a multiplicity of test structures 5 and a multiplicity of integrated memory circuits 9. The memory circuits 9 each have a memory cell array 8, which may be formed as in FIG. 1. In particular, each memory cell array 8 contains a multiplicity of volatile memory cells each having a selection transistor and a storage capacitor. The storage capacitors are formed as trench capacitors, in the same way as the trench capacitors of the test structures 5, which are modeled on the memory cell arrays 8.

Figure 11:
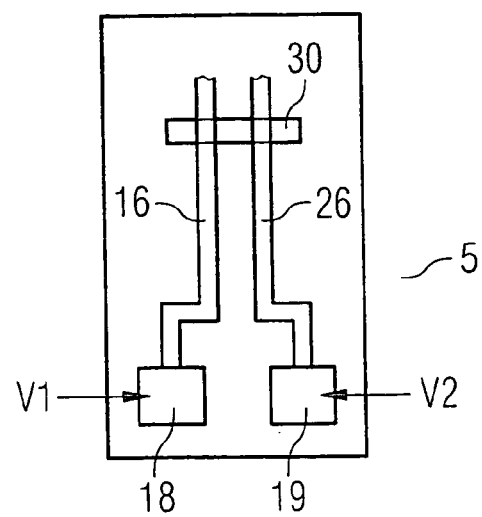
FIG. 11 shows a detail view of a test structure of the semiconductor product from FIG. 10.

FIG. 11 shows an enlarged detail from a test structure 5 from FIG. 10. This detail indicates the ends of the first interconnect 16 and of the second interconnect 26, which can be biased with the aid of test needles of a contact head. In a preferred method of the invention, the contact head can be placed temporarily onto the semiconductor wafer 2 in order to test the integrated memory circuits 9. In order in this case to simultaneously perform electrical measurements at the test structures 5, a first area contact 18 and a second area contact 19 are provided at the ends of the first 16 and the second interconnect 26. The first interconnect 16 is connected to the first area contact 18, which can be biased with a first electrical potential V1 by means of a first test needle. The second interconnect 26 is connected to the second area contact 19, which can be connected to another, second electrical potential V2 by means of a second test needle. As a result, via the two interconnects and via the current path opened between them, an electric current flows which enables the calculation of the nonreactive resistance given a known current intensity and a known potential difference. The nonreactive resistance of the dopant diffusion regions 15, 25 and of the inner capacitor electrode 31 can be determined from the electrical measurement. Only the trench capacitor 30 that is greatly extended transversely with respect to the course of the interconnects 16, 26 is illustrated in FIG. 11, for the sake of clarity. The remaining regions of the current path, although they are not illustrated, are formed in the manner illustrated in the previous figures.

Figure 12:
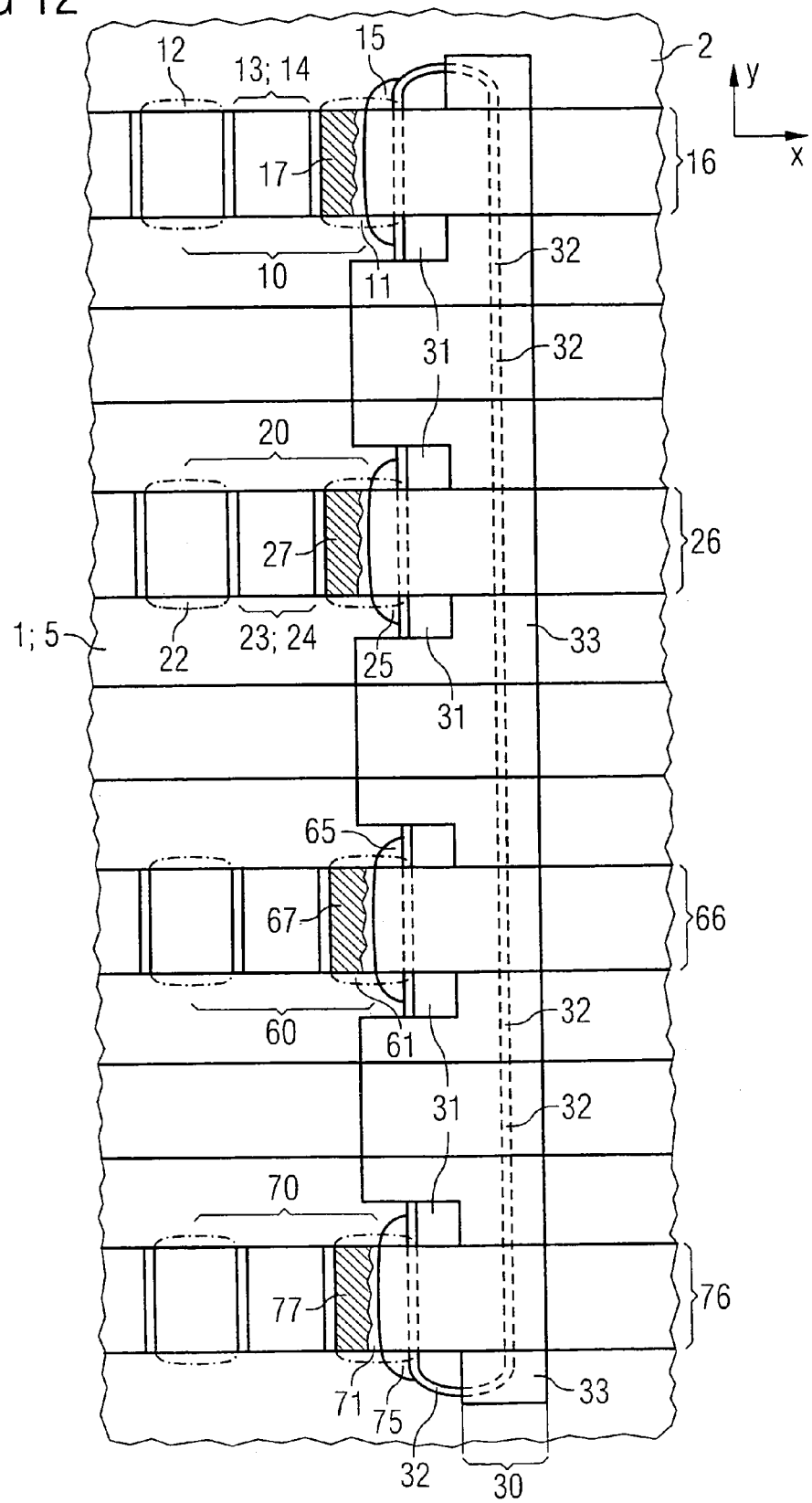
FIG. 12 shows a schematic plan view of a further embodiment of a test structure.

FIG. 12 shows a schematic plan view of a semiconductor product, according to a preferred embodiment of the invention, having a test structure. The illustration shows a plan view of a partial region of a test structure, in which a trench capacitor 30 is illustrated, which additionally has a larger dimension in the direction y transversely with respect to the course of the first 16 and the second interconnect 26, and which is connected to source/drain regions of even further transistors by additional dopant diffusion regions. The plan view of FIG. 12 corresponds to FIG. 5 with regard to the details illustrated. In addition, however, the test structure 5 of FIG. 12 has a third dopant diffusion region 65, which conductively connects the inner capacitor electrode 31 to a first source/drain region 61 of a third transistor 60. The first source/drain region 61 of the third transistor 60 is simultaneously short-circuited with a third interconnect 66 by a third contact connection 67. With the aid of the three dopant diffusion regions 15, 25 and 65 and the three interconnects 16, 26 and 66, it is possible to carry out an electrical measurement in which both the current intensity and a tapped-off voltage can be read out, from which it is possible to determine the nonreactive resistance along a current path through two of the dopant diffusion regions, and through the inner capacitor electrode. Such an electrical measurement will be described with reference to FIG. 13. The test structure 5 illustrated in FIG. 12 furthermore has a fourth dopant diffusion region 75, which conductively connects the inner capacitor electrode 31 to a first source/drain electrode 71 of a fourth transistor 70. The first source/drain region 71 of the fourth transistor 70 is furthermore short-circuited with a fourth interconnect 76 by a fourth contact connection 77. With the aid of the four interconnects depicted, which are in each case connected to the inner capacitor electrode 31 without the interposition of an inversion channel but rather directly via the respective dopant diffusion region, it is possible to carry out the electrical measurement described below with reference to FIG. 14.

Figure 13:
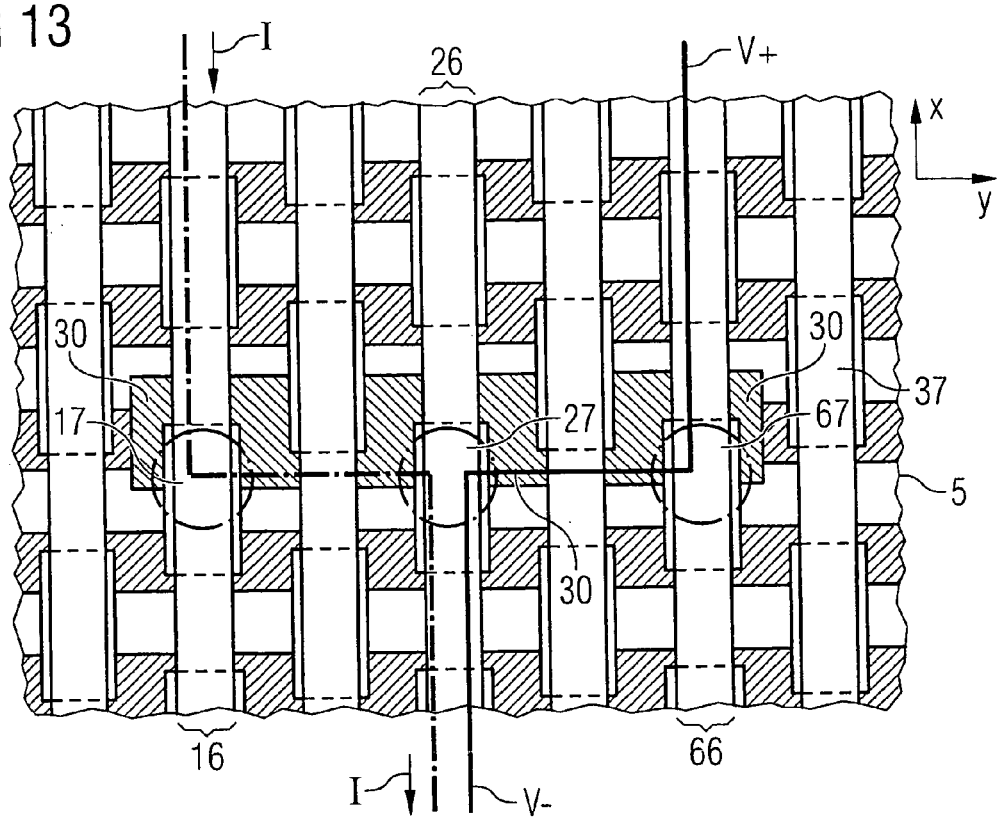
FIG. 13 shows a plan view of a test structure provided according to another preferred embodiment of the invention with schematic illustration of the electrical contact-making for a sheet resistance measurement.

FIG. 13 illustrates a method according to another embodiment of the invention for carrying out an electrical measurement at a test structure 5, the trench capacitor 30 of which is connected to the interconnects 16, 26 and 66 via dopant diffusion regions 17, 27 and 67 and via the first source/drain regions and contact connections respectively illustrated in FIG. 12. Along the line illustrated in dash-dotted fashion in FIG. 13, a current I having a known current intensity is conducted from the first interconnect 16 through the trench capacitor 30 as far as the second interconnect 26. The second interconnect 26 is arranged exactly in the middle between the first 16 and the third interconnect 66. By means of a four-point measurement during which a connection V− of a voltmeter is additionally connected to the second interconnect 26, and during which a further connection V+ of the voltmeter is connected to the third interconnect 66, a potential difference can be measured along the current path illustrated by a solid line. Since the current path between the first and second interconnects runs mirror-symmetrically with respect to the current path between the second and third interconnects and, consequently, the nonreactive resistance of the two current paths is equal in magnitude, the nonreactive resistance can be determined from the quotient of the measured potential difference between the second and third interconnects and the known current intensity of the current, which flows along the current path between the first and second interconnects. Since the inner capacitor electrode 31 is usually very heavily doped and is thus a good electrical conductor, the nonreactive resistance of each current path approximately corresponds to double the nonreactive resistance of one of the dopant diffusion regions 15, 25.

Figure 14:
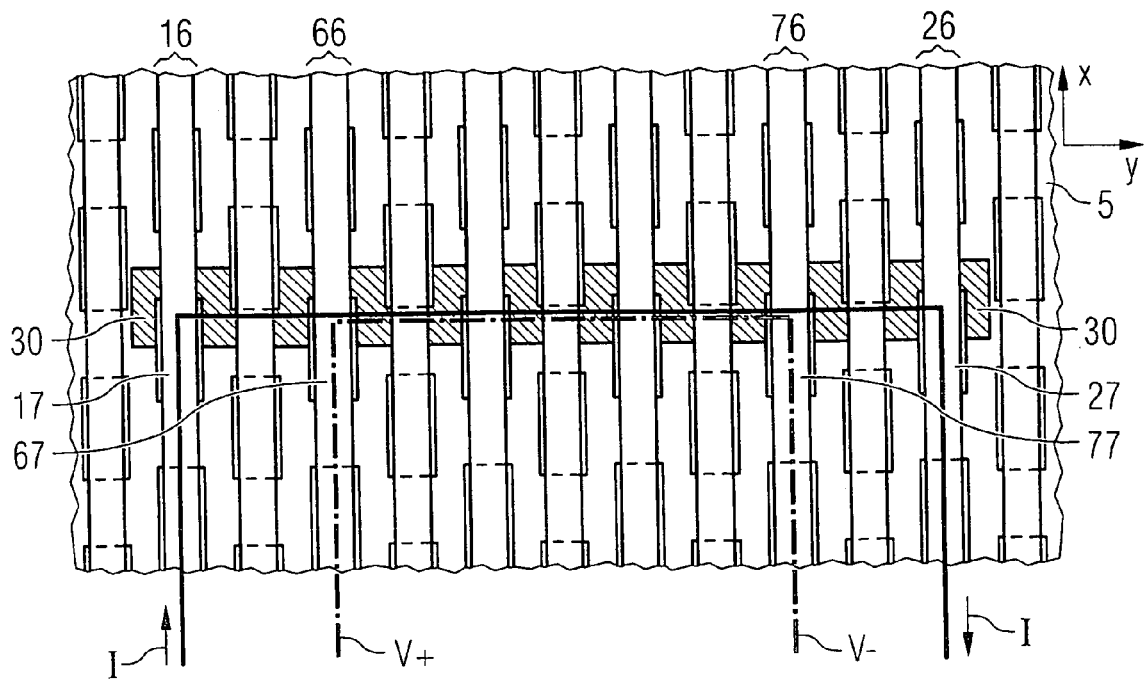
FIG. 14 shows a plan view of another test structure provided according to another preferred embodiment of the invention with schematic illustration of the electrical contact-making.

FIG. 14 shows an alternative preferred measuring method of the invention, by means of which, it is possible to measure the sheet resistance of the inner capacitor electrode 31. For this purpose, provision is made of a test structure 5 having a trench capacitor 30 extending over many adjacent interconnects in the direction y perpendicular to the course of the interconnects. The trench capacitor 30 from FIG. 14 is electrically connected to the interconnects 16, 26, 66 and 76 at four locations by the dopant diffusion regions 15, 25, 65, 75 illustrated in FIG. 12, the first source/drain regions 11, 21, 61, 71 and contact connections 17, 27, 67 and 77. In FIG. 14, the order of the numbering of the interconnects is interchanged in comparison with FIG. 5; the first and second interconnects 16, 26, between which a current I having a predetermined current intensity flows, are situated at the outermost opposite ends of the trench capacitor 30. The third interconnect 66 and the fourth interconnect 76 are arranged between them at a smaller distance from one another, there being a mirror-symmetrical arrangement of the interconnects with respect to the center of the capacitor trench 30. Many further interconnects are situated between the third and fourth interconnects, so that, within the inner capacitor electrode 31, a long path distance has to be bridged between the third interconnect 66 and the fourth interconnect 76. As a result, when tapping off a voltage drop that is to be measured with the aid of a voltmeter, it is possible to determine the sheet resistance of the inner capacitor electrode 31. For this purpose, a connection V+, V− of the voltmeter is connected to the third interconnect 66 and the fourth interconnect 76, respectively, and when the current I flows between the first 16 and the second interconnect 26, the voltage is measured with the aid of the voltmeter.

By use of the embodiments of the present invention, it is possible in particular for memory cell arrays of DRAMs to be examined electrically by means of test structures of the design described above being formed in the sawing frame (scribe line) of a semiconductor wafer. Instead of the above-described test structures provided with "single sided buried straps", it is equally possible to provide test structures having "double sided buried straps". In this case, dopant diffusion regions by means of which the inner capacitor electrode 31 can be electrically connected are provided on mutually opposite sides of the edge of trench capacitors, as for instance in the case of so-called MINT cells (merged isolation and node trench).

According to the preferred embodiments of the invention, those contacts which typically produce the electrical connection between source/drain regions and the bit lines are arranged on those source/drain regions, which are connected to an inner capacitor electrode by a buried strap. This novel arrangement avoids high series resistances on account of transistor channels via which the current paths conventionally run. As a result, the nonreactive resistance of a buried strap, which is typically approximately 15 kohms, can be measured more precisely.

Although the present invention and its advantages have been described in detail, in the form of illustrative embodiments, it should be understood that various changes, substitutions and alterations can be made herein without departing from the spirit and scope of the invention as defined by the appended claims. For example, many of the features and functions discussed above can be implemented in software, hardware, or firmware, or a combination thereof, while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor product having a semiconductor substrate and a test structure, which has the following:
    at least one first transistor having a first and a second source/drain region arranged in the semiconductor substrate, an insulation layer and a gate electrode, the gate electrode being isolated from the semiconductor substrate by the insulation layer;
    at least one trench capacitor having an inner capacitor electrode arranged in a trench;
    a dopant diffusion region arranged in the semiconductor substrate connecting the inner capacitor electrode to the first source/drain region;
    at least one first interconnect;
    at least one first contact connection connected to the first interconnect; and
    the first contact connection making contact with the first source/drain region of the first transistor, said source/drain region being connected to the inner capacitor electrode by the dopant diffusion region.

2. The semiconductor product as claimed in claim 1, wherein:
    the first contact connection is a contact hole filling arranged on the first source/drain region.

3. The semiconductor product of claim 1, wherein:
    the first contact connection short-circuits the first interconnect directly with the first source/drain region.

4. The semiconductor product of claim 1, wherein the test structure further comprises:
    a second transistor having a first and a second source/drain region, which are arranged in the semiconductor substrate, an insulation layer and a gate electrode, the gate electrode being isolated from the semiconductor substrate by the insulation layer;
    a further dopant diffusion region arranged in the semiconductor substrate, which further dopant diffusion region connects the inner capacitor electrode to the first source/drain region of the second transistor;
    a second interconnect; and
    a second contact connection connected to the second interconnect.

5. The semiconductor product of claim 4, wherein:
the second contact connection makes contact with the first source/drain region of the second transistor, said source/drain region being connected to the inner capacitor electrode by the further dopant diffusion region.

6. The semiconductor product of claim 4, wherein:
the second contact connection makes contact with the second source/drain region of the second transistor.

7. The semiconductor product claim 4, wherein:
the first and the second transistor are connected to the same trench capacitor by the dopant diffusion region and the further dopant diffusion region.

8. The semiconductor product of claim 4, wherein:
the first and the second interconnect run parallel to one another, the first transistor is arranged in a first region of the semiconductor substrate, said first region being covered by the first interconnect, and the second transistor is arranged in a second region of the semiconductor substrate, said second region being covered by the second interconnect, and, in the direction (y) transversely with respect to the course of the first and second interconnects, the trench capacitor has a width such that it extends from the first region of the semiconductor substrate as far as the second region of the semiconductor substrate.

9. The semiconductor product of claim 8, wherein:
in a direction (y) running parallel to the surface of the semiconductor substrate and transversely with respect to the course of the first and second interconnects, the trench capacitor has an extent (a) greater than triple the width of the first interconnect.

10. The semiconductor product of claim 4, wherein:
the trench capacitor is arranged with its lateral main extending direction oriented transversely with respect to the course of the first and second interconnects in the semiconductor substrate.

11. The semiconductor product of claim 4, wherein:
the dopant diffusion region and the further dopant diffusion region are arranged at an outer edge of the trench capacitor on the same side of the trench capacitor.

12. The semiconductor product of claim 4, wherein:
the inner capacitor electrode connects the dopant diffusion region to the further dopant diffusion region.

13. The semiconductor product of claim 4, wherein:
the first source/drain region of the first transistor and the first source/drain region of the second transistor are connected to one another in low-resistance fashion by the dopant diffusion region, the inner capacitor electrode and the further dopant diffusion region.

14. The semiconductor product of claim 4, wherein:
the test structure has a first and a second exposed area contact, the first interconnect being connected to the first area contact and the second interconnect being connected to the second area contact.

15. The semiconductor product of claim 4, wherein:
the semiconductor product furthermore has at least one integrated memory circuit having a multiplicity of storage capacitors, selection transistors, word lines and bit lines, the first and the second interconnect of the test structure being arranged in a same interconnect plane as the bit lines of the integrated memory circuit.

16. The semiconductor product of claim 15, wherein:
the test structure has a regular arrangement of transistors, further trench capacitors and interconnects which are modeled on the integrated memory circuit.

17. The semiconductor product as claimed in one of claim 16, wherein in at least one lateral direction (y) parallel to a surface of the semiconductor substrate, the trench capacitor of the test structure has an extent (a), which is at least double the extent of the further trench capacitors in this direction (y).

18. The semiconductor product of claim 4, wherein:
the first and the second interconnect are bit lines.

19. The semiconductor product of claim 1, wherein:
the test structure is arranged in a sawing frame of the semiconductor substrate, said sawing frame in each case individually surrounding a multiplicity of integrated memory circuits.

20. The semiconductor product as claimed in one of claim 1, wherein the test structure further comprises:
a third transistor having a first source/drain region;
a third dopant diffusion region arranged in the semiconductor substrate, which third dopant diffusion region connects the inner capacitor electrode to the first source/drain region of the third transistor;
a third interconnect; and
a third contact connection, which is connected to the third interconnect and makes contact with the first source/drain region of the third transistor.

21. The semiconductor product of claim 20, wherein the test structure further comprises:
a fourth transistor having a first source/drain region;
a fourth dopant diffusion region arranged in the semiconductor substrate, which fourth dopant diffusion region connects the inner capacitor electrode to the first source/drain region of the fourth transistor;
a fourth interconnect, and
a fourth contact connection, which is connected to the fourth interconnect and makes contact with the first source/drain region of the fourth transistor.

22. A method for carrying out an electrical measurement at a test structure of a semiconductor product, comprising:
providing said semiconductor product having said test structure, the test structure comprising at least one transistor having a first and a second source/drain region arranged in a semiconductor substrate, an insulator layer, and a gate electrode isolated from the semiconductor substrate by the insulation layer, and having at least one trench capacitor with an inner capacitor electrode arranged in a trench, and a dopant diffusion region arranged in the semiconductor substrate connecting the inner capacitor electrode to the first source/drain region, and at least one first interconnect and at least one first contact connection connected to the first interconnect, the first contact connection making contact with the first source/drain region of the first transistor, said source drain region being connected to the inner capacitor electrode by the dopant diffusion region, and the test structure further comprising a second transistor having a first and a second source/drain region arranged in the semiconductor substrate, the second transistor having an insulation layer and a gate electrode isolated from the semiconductor substrate by the insulation layer, and a further dopant diffusion region formed in the semiconductor substrate, which connects the inner capacitor electrode to the first source/drain region of the second transistor, the second transistor having a second interconnect and a second contact connection connected to the second interconnect, which makes contact with the first source/drain region of the second transistor, the first source/drain region of the second transistor being connected to the inner capacitor electrode by the further dopant diffusion region; and
connecting the first interconnect to a first potential connection and connecting the second interconnect to a second potential connection, and biasing the first and the second potential connection in such a way that a current having a predetermined current intensity flows from the first potential connection via the test structure to the second potential connection.

23. The method as claimed in claim 22, further comprising;
arranging the second interconnect between the first interconnect and a third interconnect and in which the distance between the first and second interconnects is equal in magnitude to the distance between the second and third interconnects; and
connecting a respective connection (V+, V−) of a voltmeter to the second and the third interconnect, and a measuring voltage drop between the second and the third interconnect.

24. The method of claim 22, further comprising:
arranging a third and a fourth interconnect between the first and the second interconnect, the distance between the third interconnect and the first interconnect being equal in magnitude to the distance between the fourth interconnect and the second interconnect; and
connecting a respective connection (V+, V−) of a voltmeter to the third and the fourth interconnect, and measuring a voltage drop between the third and the fourth interconnect.

* * * * *